(12) United States Patent
Doris et al.

(10) Patent No.: US 7,439,144 B2
(45) Date of Patent: Oct. 21, 2008

(54) CMOS GATE STRUCTURES FABRICATED BY SELECTIVE OXIDATION

(75) Inventors: Bruce B. Doris, Brewster, NY (US); Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 11/307,671

(22) Filed: Feb. 16, 2006

(65) Prior Publication Data

US 2007/0190713 A1    Aug. 16, 2007

(51) Int. Cl.
*H01L 21/8222* (2006.01)
*H01L 21/4763* (2006.01)

(52) U.S. Cl. .............. 438/314; 438/639; 257/E21.023; 257/E21.025

(58) Field of Classification Search ................. 438/314, 438/639, 947, 705, 724; 257/E21.023, E21.024, 257/E21.025, E21.026, E21.033
See application file for complete search history.

(56) References Cited

U.S. PATENT DOCUMENTS

| | | | |
|---|---|---|---|
| 4,502,914 A * | 3/1985 | Trumpp et al. | 438/424 |
| 4,525,919 A | 7/1985 | Fabian | |
| 4,871,630 A | 10/1989 | Giammarco et al. | |
| 5,384,382 A | 1/1995 | Mori et al. | |
| 5,674,409 A | 10/1997 | Muller | |
| 5,795,830 A | 8/1998 | Cronin et al. | |
| 6,194,268 B1 | 2/2001 | Furukawa et al. | |
| 6,423,475 B1 * | 7/2002 | Lyons et al. | 430/314 |
| 6,492,212 B1 | 12/2002 | Ieong et al. | |
| 6,566,759 B1 | 5/2003 | Conrad et al. | |
| 6,632,741 B1 | 10/2003 | Clevenger et al. | |
| 7,026,247 B2 * | 4/2006 | Dokumaci et al. | 438/705 |
| 2001/0055221 A1 | 12/2001 | Noble | |

* cited by examiner

*Primary Examiner*—Walter L Lindsay, Jr.
(74) *Attorney, Agent, or Firm*—Ira D. Blecker; Wenjie Li

(57) ABSTRACT

A sidewall image transfer process for forming sub-lithographic structures employs a layer of sacrificial polymer containing silicon that is deposited over a gate conductor layer and covered by a cover layer. The sacrificial polymer layer is patterned with conventional resist and etched to form a sacrificial mandrel. The edges of the mandrel are oxidized or nitrided in a plasma at low temperature, after which the polymer and the cover layer are stripped, leaving sublithographic sidewalls. The sidewalls are used as hardmasks to etch sublithographic gate structures in the gate conductor layer.

19 Claims, 3 Drawing Sheets

CMOS GATE STRUCTURES FABRICATED BY SELECTIVE OXIDATION

TECHNICAL FIELD

The field of the invention is that of integrated circuit fabrication, in particular fabricating sub-lithographic structures.

BACKGROUND OF THE INVENTION

The art of integrated circuit fabrication has long pressed for reducing the dimensions of structures beyond (below) the nominal limits of the steppers and etching processes, referred to as sub-lithographic structures because the dimensions being fabricated are smaller than the current ground rules.

A well developed method of forming sub-lithographic gates for field effect transistors is the sidewall image transfer method in which a sidewall spacer (such as silicon nitride (Si3N4), for example) having a thickness less than that permitted by the current ground rules is formed on the sides of a sacrificial structure that is later removed.

The remaining sidewall spacer after removal of the sacrificial structure is used as a hardmask to etch the layers(s) below with a directional reactive ion etch. Since the sidewall has a (sublithographic) width less than the ground rules, the structure formed in the layer below will also have a sub-lithographic width. An example is shown in IEEE Transactions on Electron Devices, vol 49, March 2002, p436-441.

The sidewall material is selected to deposit conformally in order to maintain a desired width and to be etch resistant, to act as a hardmask. The layer below is selected to have appropriate electrical properties. As a common example, the sidewall spacer is silicon nitride and the layer below is polysilicon (poly).

As structure dimensions shrink, process variations that were previously insignificant become important, and the conventional sidewall image transfer process suffers from excessive variation across the circuit (across chip linewidth variation—ACLV). The conventional sidewall image transfer approach has difficulties, such as a) etch loading effects that cause variations in the spacer width due to pattern density or pattern pitch changes; and b) sputtering of the spacer during spacer etch creates sloped and asymmetric profiles, which can lead to image variation across the substrate.

The art would benefit from a sublithographic process having less variation in dimension.

SUMMARY OF THE INVENTION

The invention relates to a sidewall image transfer method in which the sidewall images are formed by reacting the material on the sides of a sacrificial mandrel with a reactant gas.

A feature of the invention is the use of a material developed as a photosensitive material for use in lithography as the base material for the sidewalls.

A feature of the invention is the use of low temperature oxidation, thereby avoiding degradation of high-k gate dielectrics.

Another feature of the invention is the avoidance of oxide etching after the sidewall images have been formed.

DETAILED DESCRIPTION

Figure 1:
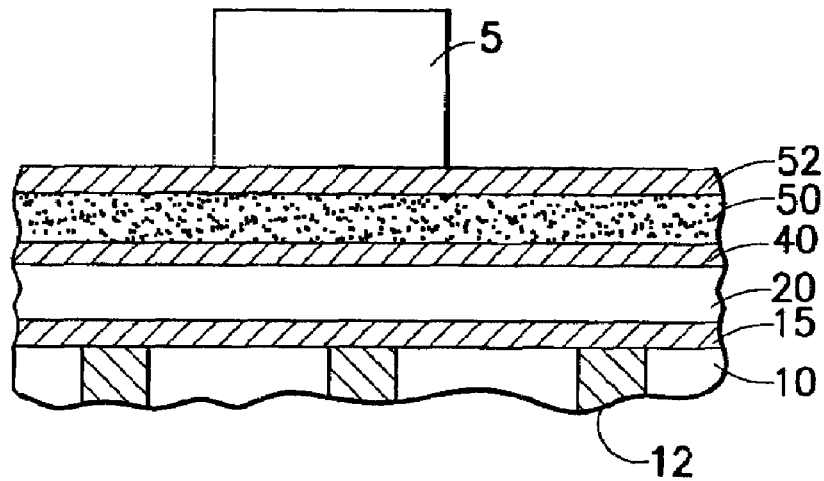
FIG. 1 shows a portion of an integrated circuit wafer that will contain transistors according to the invention.

FIG. 1 shows a portion of a silicon or other semiconductor wafer 10, having unpatterned layers just before the step of forming the sacrificial structure that will be used as a step in forming a field effect transistor.

Preliminary steps such as threshold implants, isolation trenches, planarizing and the like have already been performed if desired, referred to as preparing the substrate. Isolation trenches 12 are conventional.

A gate dielectric 15, illustratively 1-1.5 nm of thermal oxide ($SiO_2$) or 1-2 nm of hafnium silicate has been grown or deposited on substrate 10.

A gate conductor film 20, such as 50-150 nm of polysilicon, tungsten, or tungsten suicide is deposited. In the illustrative example, an optional hardmask 40, 3-5 nm of silicon nitride ($Si_3N_4$) has been deposited.

In general, the film 20 may be used in a structure that is not a transistor, in which case, film 20 may be referred to as a structure layer.

The sacrificial layer 50, 50-150 nm of polymethylsilane (also called polysilane), is deposited according to a conventional process of plasma polymerization of silane species such as methylsilane. An example of a deposition process is found in Journal of Vacuum Science and Technology B, vol. 18, 2000, pp. 793-798. This material was developed as a photoresist and is being used here as a non-photosensitive material.

A cap layer 52 of 20-40 nm of amorphous silicon is deposited over the polysilane 50 to serve as a protective cap against oxidation of the upper surface of the polysilane.

These layers may be deposited in a multi-chamber Applied Materials deposition tool or a similar tool.

A conventional photoresist layer is deposited, exposed and developed to form resist plug 5, having the dimensions of a sacrificial mandrel to serve as base material for the sidewall images that will be formed.

Figure 2:
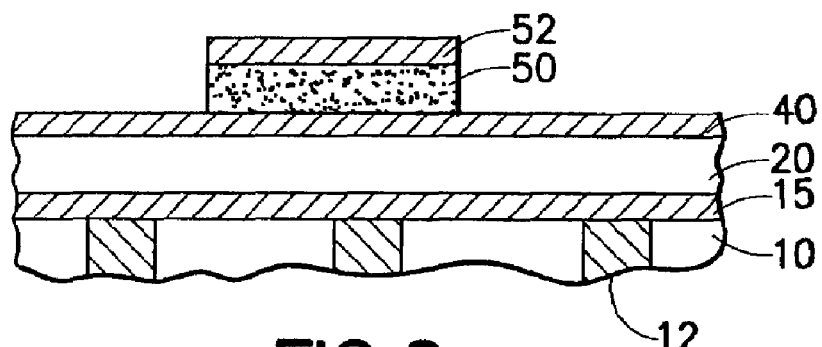
FIG. 2 shows the same area after patterning the photosensitive (sacrificial) material.

FIG. 2 shows the result of a conventional, directional silicon reactive ion etch (RIE) that etches the cap layer 52 and polysilane 50, stopping on hardmask 40.

Figure 3:
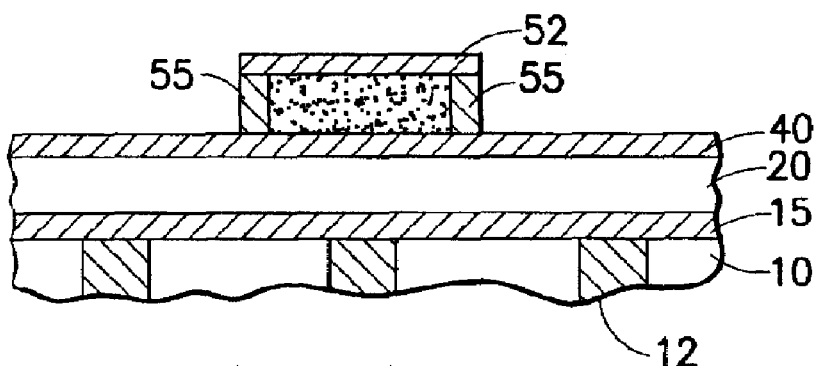
FIG. 3 shows the sacrificial structure after oxidizing the sides.

FIG. 3 shows the result of introducing an oxygen plasma into the etch chamber of the tool and oxidizing the sides of the polysilane mandrel 50 in the plasma, oxygen or ozone to form oxide sidewall images 55. The term "sidewall images" refers to the oxide (or other material) after the conversion step. Those skilled in the art will appreciate that other oxidizing reagents may be used. Illustratively, in current technology for the 90 nm node, a sidewall thickness of 60-70 nm is typical, but smaller thicknesses will doubtless be required in the future, such as 40-50 nm for the 65nm node and 25-35 nm for the 45 nm node.

The plasma oxidation process is performed at a nominal temperature of 20-100 deg C., with a preferred value of 25 deg C., so that the amorphous silicon cap 52 is not oxidized to any substantial degree. This is an advantageous feature of the invention because it avoids amplifying the size of any particle defects that are present on the wafer surface prior to the formation of the sidewall oxide. In a conventional process, the oxide sidewall is typically deposited, such as from a vapor of tetrakis-ethoxysilane (TEOS). The vapor deposited oxide will form on particles, making them larger and more likely to cause a defect in the semiconductor device. By forming the oxide sidewall through an oxidation of an existing polysilane mandrel, we avoid this amplification in the size of particulate defects that are present on the substrate surface. The ability to oxidize the mandrel material at room temperature (or slightly above) is a further advantage because high-k gate dielectric materials such as hafnium oxides, hafnium silicates, zirconium oxides, zirconium silicates, tantalum oxides and tantalum silicates are examples of high-k materials that are adversely affected by temperatures over 800 degrees C. required to oxidize the polysilicon or other mandrel materials in the prior art.

Cap 52 and the remaining polysilane are stripped with a conventional chlorine plasma silicon etch process', rather than a resist strip.

Since the polysilane was not hardened by oxidation processing, the conventional chlorine or bromine plasma stripping process removes the material, selective to the remaining oxide sidewalls 55 and to the nitride hard mask 40.

Those skilled in the art will appreciate that other variations of the process may be used. As one alternative, the amorphous silicon cap over the polysilane may be omitted if the process simplification compensates for the risk of increased linewidth variation due to non-selectivity of the etch to the sidewalls during the removal of oxide from the upper surface of the mandrel by directional reactive ion etching.

Another variation is the formation of a mandrel of polysilicon or amorphous silicon oxidized with an oxygen plasma at 400-500 deg C. to create the surface layer of oxide on the mandrel. In this case, the protective cap layer 52 is preferably silicon nitride rather than polysilicon; or the cap layer could be omitted. In the case in which the oxide cap is omitted, the RIE directionally etches the oxidized top surface of the mandrel prior to removal of the polysilicon interior of the mandrel, leaving the oxide sidewall images on the substrate. The sidewall images are transferred into the hard mask 15 by etching hard mask layer 15 with the sidewall images as an etching mask. Then, the hard mask pattern is trimmed by using a mask as shown in FIG. 4B.

Figure 4A:
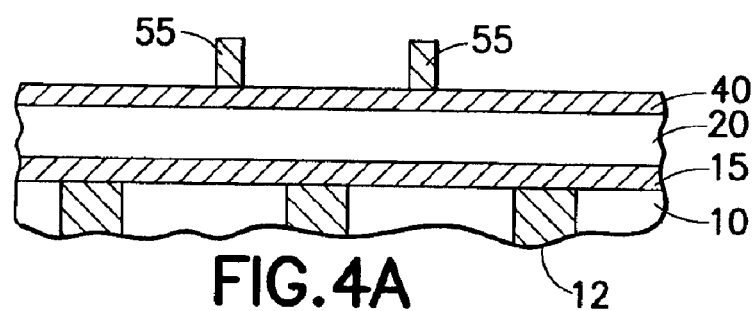
FIG. 4A shows the area after stripping the sacrificial layer to expose the sidewall images.

FIG. 4A shows in cross section the result of the stripping process, in which a continuous loop structure 55 that was formed around the perimeter of each mandrel remains. Usually it is necessary to trim this loop into segments in order to form discrete gate structures. The loop can be trimmed by patterning with resist and etching away the oxide loop as desired, using the nitride etch stop layer to protect the gate conductor film during this loop trim etch.

Figure 4B:
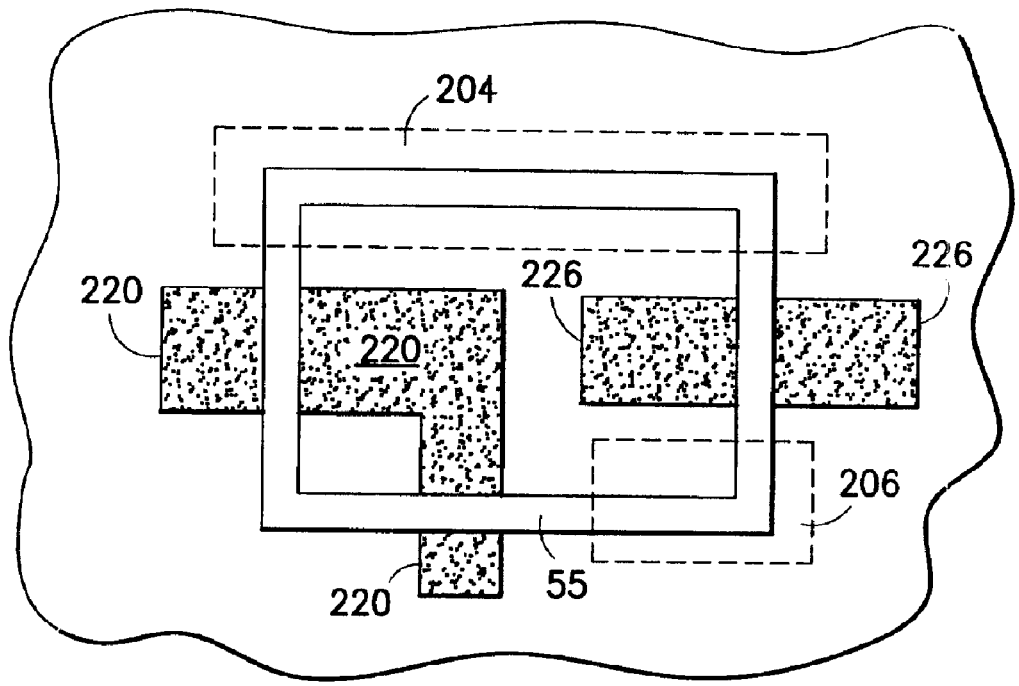
FIG. 4B shows a top view of an illustrative layout.

FIG. 4B shows a top view of an illustrative example. A loop 55 has been trimmed by removing the corners 204 and 206, denoted with dashed lines. An example of a trimming method is shown in U.S. Pat. No. 6,632,741. Implanted areas 220 and 226 are shown that function as sources and drains. Note that electrode 220 is common to two portions of loop 55, as in an arrangement such as an inverter or other circuit, so that two transistors with a common gate are in series. Isolation between the transistors is denoted schematically by the white space between electrodes. The arrangement is illustrative and no attempt has been made to pack the transistors compactly.

Figure 5:
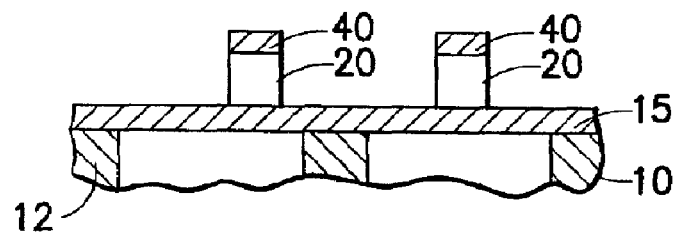
FIG. 5 shows the area after a sidewall image transfer process to the form the final gate electrodes.

In a first version of the invention, shown in FIG. 5, the oxide pattern of sidewalls 55 (after any trimming) is etched into the hardmask 40 and gate 20 to create the final gate structure.

Figure 6:
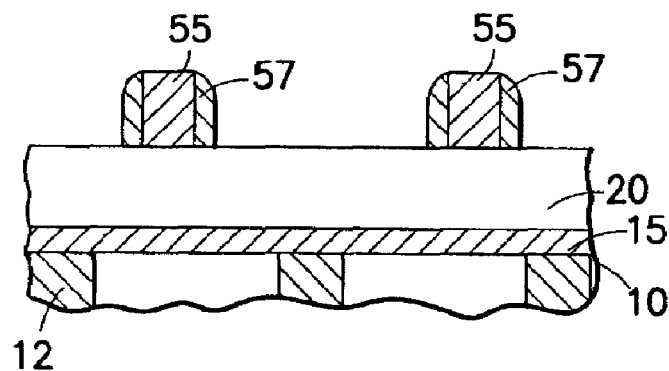
FIG. 6 shows completed transistors.
Figure 7:
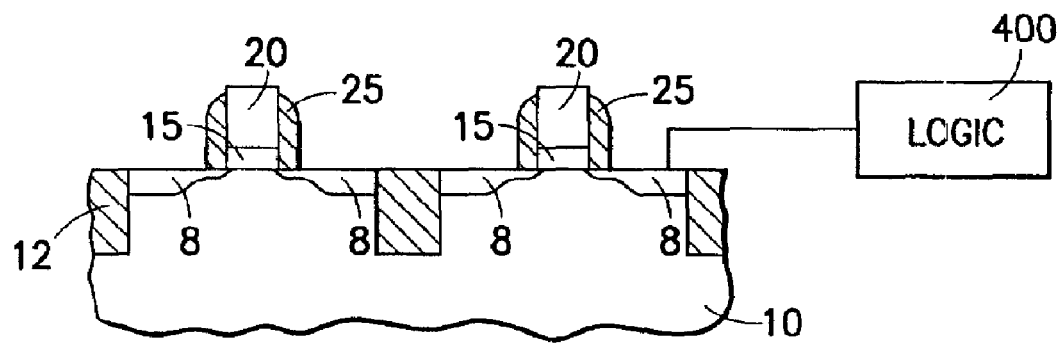
FIG. 7 shows completed transistors connected to the remainder of the circuit.

The processing of the transistor then continues, as shown in FIGS. 6 and 7, with conventional nitride spacers 57 shown in FIG. 6 broadening the oxide loop 55 in selected locations. The processing continues in FIG. 7, showing the result of transferring the sidewall image to poly layer (gate layer) 20. FIG. 7 shows the result of transistor formation, with halo and extension implants and source and drain implants denoted collectively by numeral 8 bracketing the gate 20 and gate insulator 15 of the individual transistors.

Box 400, labeled logic, in FIG. 7, represents schematically the remainder of the circuit being constructed.

FIG. 6 shows the result of an additional step in an alternative version of the invention, in which nitride spacers 57 have been formed on the sides of sidewall oxides 55 by a standard process of depositing a conformal film and then removing the film over the horizontal surfaces. This has the effect of widening the sidewalls to produce a desired hardmask width that is greater than the width provided by the first version of the invention. A subset of sidewalls 57 may be stripped to remove the nitride spacer from selected gates so that one polarity (PFET or NFET) has the gate width set by the oxidation process (the width of the loop 55) and the other polarity has the wider width set by the additional nitride spacers 57.

The polysilane mandrel could be made from different types of silane starting reagents, such as methyl silane, ethylsilane, propylsilane, phenylsilane, dimethylaminosilane, ethoxysilane and similar materials. It could also be made with various amounts of germanium in the mix, as germane gas, methylgermane, ethylgermane, phenyl germane, and other derivatives. The germanium content can be varied considerably, and would affect the rate of oxidation of the mandrel. These and other equivalent materials will be referred to as silane starting materials.

In the polysilane, embodiment, one could also spin apply alkyl or aryl polysilane resist materials, as known in the art, using a cap layer 52, to separate this spin on material from the imaging resist layer. These polysilane polymers can also be oxidized with oxygen plasma or ozone at 25-100 C.

In addition, the mandrel could also be made from spin-on solvent soluble polysilanes as material, using a process disclosed in U.S. Pat. No. 5,384,382, incorporated by reference.

In a further variation, materials such as aluminum, zirconium, hafnium, magnesium, germanium, chrome, tantalum, tungsten, referred to as metal mandrel materials, could be used as mandrel materials, with plasma oxidation or nitridation of these films being used to form the sidewall pattern. Anodization may also be used to form these oxidized sidewalls on the metal mandrel. The metal mandrel could also be used with a polysilicon cap or silicon nitride protective cap layer 52, or without a cap. The un-oxidized metal mandrel materials can be removed with RIE processing, leaving the oxidized sidewalls as a pattern for the gate electrode.

Those skilled in the art will appreciate that the invention can be practiced with bulk or I substrates, with silicon or SiGe as the device layer to hold the transistors and with FinFETs as well as the planar transistors illustrated here.

While the invention has been described in terms of two preferred embodiments, those skilled in the art will recognize that the invention can be practiced in various versions within the spirit and scope of the following claims.

What is claimed is:

1. A method of fabricating at least one sublithographic structure comprising the steps of:
   depositing a structure layer on a substrate;
   depositing a layer of a mandrel material over a cap layer, said layer of mandrel material comprises a polymer of silane;
   patterning said layer of mandrel material with the pattern of at least one sacrificial mandrel;
   etching said layer of mandrel material to form at least one sacrificial mandrel;
   converting at least one sub-lithographic edge region of said sacrificial mandrel to an etch-resistant sidewall;
   stripping said unconverted portions of said layer of mandrel material, leaving at said least one etch-resistant sidewall image;
   using said at least one etch-resistant sidewall image as a hardmask, etching said structure layer to form at least one sub-lithographic structure.

2. A method according to claim 1, further comprising depositing a protective layer over said layer of mandrel material and a hardmask between said structure layer and said layer of mandrel material.

3. A method according to claim 1, in which said polymer of silane comprises polymethylsilane.

4. A method according to claim 1, in which said step of converting comprises oxidizing in an oxygen plasma (or ozone or oxygen atmosphere), whereby said sidewall images comprise silicon oxide.

5. A method according to claim 1, in which said step of converting comprises nitriding in a nitrogen plasma, whereby said sidewall images comprise silicon nitride.

6. A method of fabricating at least one field effect transistor having a sublithographic gate structure comprising the steps of:
   forming a gate dielectric layer on a semiconductor substrate;
   depositing a gate layer on said gate dielectric layer;
   depositing a layer of a mandrel material over said gate layer;
   patterning said layer of mandrel material with the pattern of at least one sacrificial mandrel;
   etching said layer of mandrel material to form at least one sacrificial mandrel;
   converting at least one sub-lithographic edge region of said sacrificial mandrel to an etch-resistant sidewall;
   stripping unconverted portions of said layer of mandrel material selective to said etch-resistant sidewall, leaving at least one etch-resistant sidewall image;
   using said at least one etch-resistant sidewall image as a hardmask, etching said structure layer to form at least one sub-lithographic gate structure; and
   completing at least one field effect transistor about said sub-lithographic gate structure.

7. A method according to claim 6, in which said layer of mandrel material comprises a polymer of silane.

8. A method according to claim 7, in which said polymer of silane comprises polymethylsilane.

9. A method according to claim 6, in which said step of converting comprises oxidizing in an oxygen plasma (or ozone or oxygen atmosphere), whereby said sidewalls comprises oxide.

10. A method according to claim 6, in which said step of converting comprises nitriding in a nitrogen plasma, whereby said sidewalls comprise nitride.

11. A method according to claim 6, in which said gate dielectric layer is selected from the group comprising silicon oxide and hafnium silicate.

12. A method according to claim 9, in which said gate dielectric layer is selected from the group comprising silicon oxide and hafnium silicate.

13. A method according to claim 10, in which said gate dielectric layer is selected from the group comprising silicon oxide and hafnium silicate.

14. A method according to claim 6, further comprising the steps of:
   depositing a conformal layer of etch-resistant material over said etch-resistant sidewall after said step of stripping said unconverted portions of said layer of said mandrel layer selective to said etch-resistant sidewall and forming second sidewalls from said conformal layer of etch-resistant material, thereby forming a wider sidewall; and
   completing at least one field effect transistor about said sub-lithographic gate structure.

15. A method according to claim 14, in which said layer of mandrel material comprises a polymer of silane.

16. A method according to claim 15, in which said layer of polymer of silane comprises polymethylsilane.

17. A method according to claim 15, in which said step of converting comprises oxidizing in an oxygen plasma (or ozone or oxygen atmosphere), whereby said sidewall images comprise silicon oxide.

18. A method according to claim 15, in which said step of converting comprises nitriding in a nitrogen plasma, whereby said sidewall images comprise silicon nitride.

19. A method according to claim 15, in which said gate dielectric layer is selected from the group comprising silicon oxide and hafnium silicate.

* * * * *